United States Patent
Hall et al.

(10) Patent No.: US 7,292,449 B2
(45) Date of Patent: Nov. 6, 2007

(54) VIRTUAL GROUND RETURN FOR REDUCTION OF RADIATED EMISSIONS

(75) Inventors: Paul Kevin Hall, Lexington, KY (US); Keith Bryan Hardin, Lexington, KY (US); Brandon Robert Shields, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 437 days.

(21) Appl. No.: 11/010,553

(22) Filed: Dec. 13, 2004

(65) Prior Publication Data

US 2006/0126311 A1 Jun. 15, 2006

(51) Int. Cl.
*H05K 1/00* (2006.01)

(52) U.S. Cl. .................. 361/749; 174/32; 174/33; 174/110 R; 174/268; 333/12; 333/167; 333/172; 333/238; 333/246; 375/257

(58) Field of Classification Search ............... 361/749; 174/110 R, 268; 333/5, 167, 172, 238, 246, 333/247; 375/257
See application file for complete search history.

(56) References Cited

U.S. PATENT DOCUMENTS

| | | | |
|---|---|---|---|
| 4,538,138 A * | 8/1985 | Harvey et al. .............. 340/521 |
| 5,386,574 A * | 1/1995 | Asprey ........................ 710/100 |
| 5,414,343 A * | 5/1995 | Flaherty et al. ................ 324/66 |
| 5,427,111 A * | 6/1995 | Traub et al. ................. 600/508 |
| 6,014,409 A * | 1/2000 | Curtis ........................ 375/257 |
| 6,481,013 B1 * | 11/2002 | Dinwiddie et al. ............ 725/80 |
| 6,797,891 B1 * | 9/2004 | Blair et al. .................. 174/268 |
| 6,867,668 B1 * | 3/2005 | Dagostino et al. .......... 333/246 |
| 7,145,411 B1 * | 12/2006 | Blair et al. ..................... 333/5 |
| 2002/0172196 A1 * | 11/2002 | Komatsu et al. ............ 370/366 |
| 2002/0177357 A1 * | 11/2002 | Inui ........................... 439/502 |
| 2006/0001163 A1 * | 1/2006 | Kolbehdari et al. ......... 257/758 |

* cited by examiner

*Primary Examiner*—Tuan T. Dinh
*Assistant Examiner*—Xiaoliang Chen
(74) *Attorney, Agent, or Firm*—Michael T. Sanderson

(57) ABSTRACT

A digital apparatus having a cable comprising a plurality of high-speed and low-speed signal carrying conductors, the conductors carrying the low-speed signals are bypassed to a signal ground with selected values of capacitance so as to become virtual signal ground return conductors for the high-speed signal conductors. The selected values of capacitance have a lower impedance then the characteristic impedance of the conductors in the cable. The cable may be a multi conductor cable, a ribbon cable, a flex cable, a twisted pair cable, etc. In a similar fashion, signal conductors on a printed circuit board, not having a separate ground plane layer, may create virtual signal ground returns from the low-speed signal carrying conductors that are proximate to the high-speed signal carrying conductors for reduction of radiated electromagnetic radio frequency interference.

28 Claims, 4 Drawing Sheets

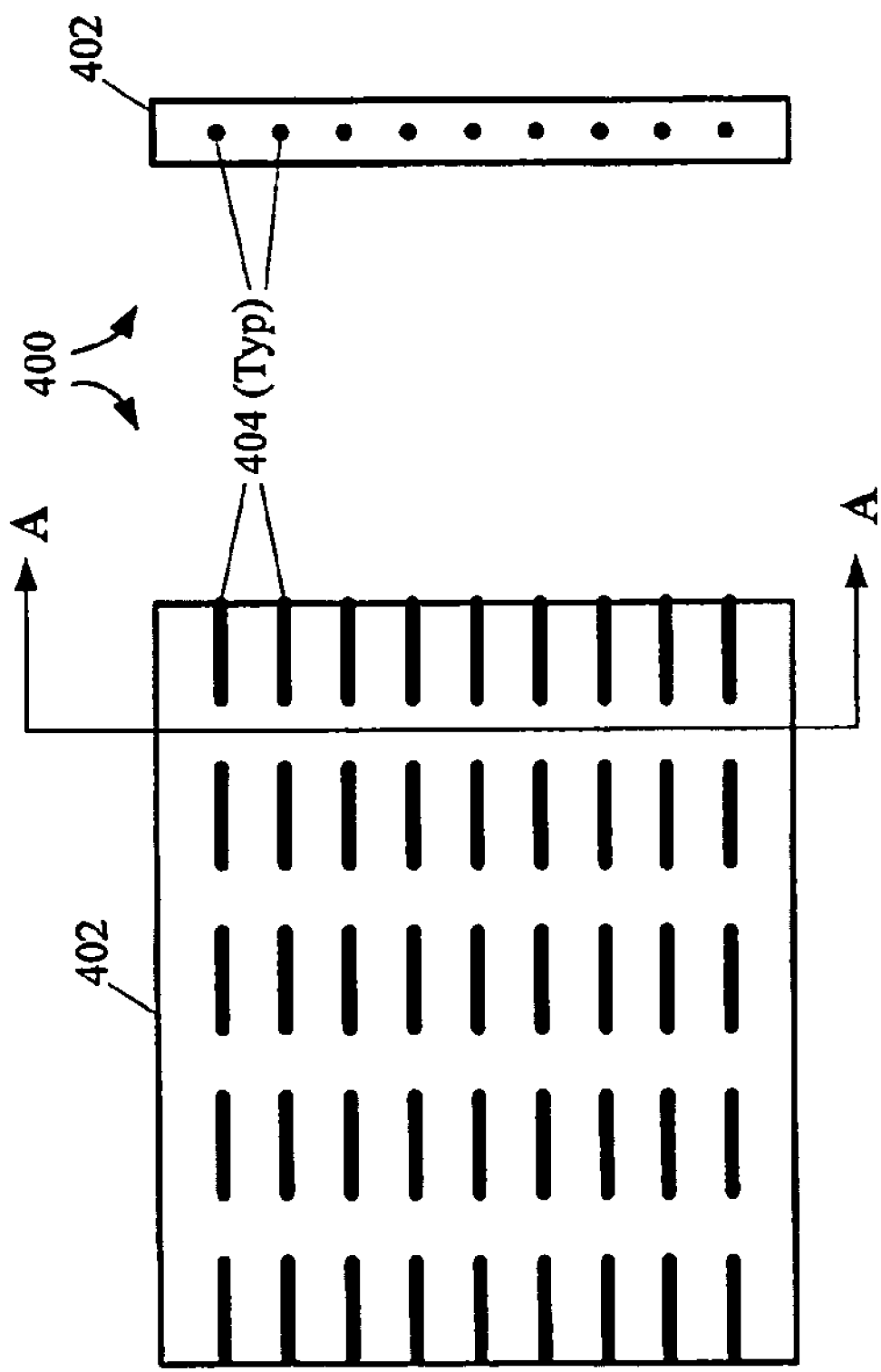

VIRTUAL GROUND RETURN FOR REDUCTION OF RADIATED EMISSIONS

TECHNICAL FIELD OF THE INVENTION

The present disclosure relates to electronic apparatus having interconnection cables and/or printed circuit boards and, more particularly, to virtual ground returns for reducing radiated electromagnetic radio frequency interference from the interconnection cables and/or printed circuit boards of the electronic apparatus.

BACKGROUND OF THE RELATED TECHNOLOGY

Interconnection cables between electronic apparatus that carry data and control signals at high frequency clock rates may generate electromagnetic radio frequency interference by acting as efficient antennas that effectively radiate undesirable radio frequency signals, e.g., radio frequency interference that may interfere with other electronic equipment that are designed to receive radio frequency signals, e.g., televisions, radio receivers, cordless telephones, etc. Electronic apparatus printed circuit boards without a separate ground plane layer may also generate undesired electromagnetic radio frequency interference. The Federal Communications Commission (FCC) has strict rules regarding the levels of electromagnetic radio frequency interference that may be emitted from electronic apparatuses.

Electromagnetic radio frequency interference may be effectively reduced by shielding interconnection cables, and for printed circuit boards having a continuous ground plane layer in close proximity to high frequency signal lines thereon. Shielded interconnection cables can be more expensive and are difficult to implement when using ribbon or flex cables. Ribbon and flex cables may comprise a plurality of conductors insulated from one another and arranged in a side-by-side planar configuration. According to an electromagnetic interference reduction technique described in "Introduction to Electromagnetic Compatibility" by Clayton R. Paul, hereby incorporated by reference herein for all purposes, the optimal number of grounded conductors for electromagnetic interference reduction is equal to the number of signal conductors plus one. This configuration allows for a grounded conductor—signal conductor—grounded conductor arrangement and is also effective in reducing radiated electromagnetic radio frequency interference from a printed circuit board not having a continuous ground plane layer. This arrangement may allow for close electromagnetic coupling of an unshielded signal line to associated ground return lines and may effectively reduce radiated electromagnetic radio frequency interference. However, the cost and space necessary for the increased number of conductors can be prohibitive and a lesser number of ground return lines are generally used. Use of less than the optimal number of ground return lines may significantly increase the amount of electromagnetic interference radiated by the cable and/or printed circuit board.

SUMMARY OF THE INVENTION

There is a need for a cable and/or printed circuit board ground return configuration that more effectively reduces the amount of electromagnetic interference radiated by the cable and/or printed circuit board without requiring a significant number of ground return lines.

According to an example embodiment of the present invention, a digital apparatus may use a multi-conductor cable having virtual ground returns for reduction of electromagnetic radiated emissions. The digital apparatus may comprise a main circuit module, a peripheral circuit module; a cable having a plurality of conductors with insulation therebetween, wherein the cable couples high-speed and low-speed signals between the main and peripheral circuit modules; and a plurality of capacitors, wherein the plurality of conductors that couple the low-speed signals between the main and peripheral circuit modules may be connected to respective capacitors of the plurality of capacitors, wherein each of the plurality of capacitors may have an impedance at a frequency, e.g., a lowest interference frequency, that may be lower, e.g., substantially lower, than the cable impedance.

According to another example embodiment of the present invention, a printed circuit board may have virtual ground returns for reduction of electromagnetic radiated emissions. The printed circuit board may comprise a plurality of signal conductors, wherein the plurality of signal conductors may carry high-speed and low-speed signals; and a plurality of capacitors, wherein the plurality of signal conductors that carry the low-speed signals may be connected to respective capacitors of the plurality of capacitors, wherein each of the plurality of capacitors may have an impedance at a frequency, e.g., a lowest interference frequency, that may be lower, e.g., substantially lower, than an impedance of the plurality of signal conductors.

According to yet another example embodiment of the present invention, a method for reducing electromagnetic radiated emissions from a digital apparatus using virtual ground returns may comprise the steps of providing a cable having a plurality of conductors for coupling high-speed and low-speed signals between main and peripheral circuit modules and connecting a plurality of capacitors to respective conductors of the plurality of conductors that couple the low-speed signals between the main and peripheral circuit modules, wherein each of the plurality of capacitors may have an impedance at a frequency, e.g., a lowest interference frequency, that may be lower, e.g., substantially lower, than the cable impedance.

According to yet another embodiment of the present invention, a circuit may have a reference voltage other than at ground potential. The reference may be at any dc voltage level. A common example includes wherein the VCC power voltage could be the reference voltage and the high frequency return path. Hereinafter, the term "ground return" will also refer to any non-zero volt signal that is considered to be the reference return voltage.

BRIEF DESCRIPTION OF THE DRAWINGS

A more complete understanding of the present disclosure may be acquired by referring to the following description taken in conjunction with the accompanying drawings wherein:

FIG. 4 is a schematic plan view of a ribbon or flex cable; and

FIG. 5 is a schematic sectional view taken along section A-A of the ribbon or flex cable illustrated in FIG. 4.

Figure 1:
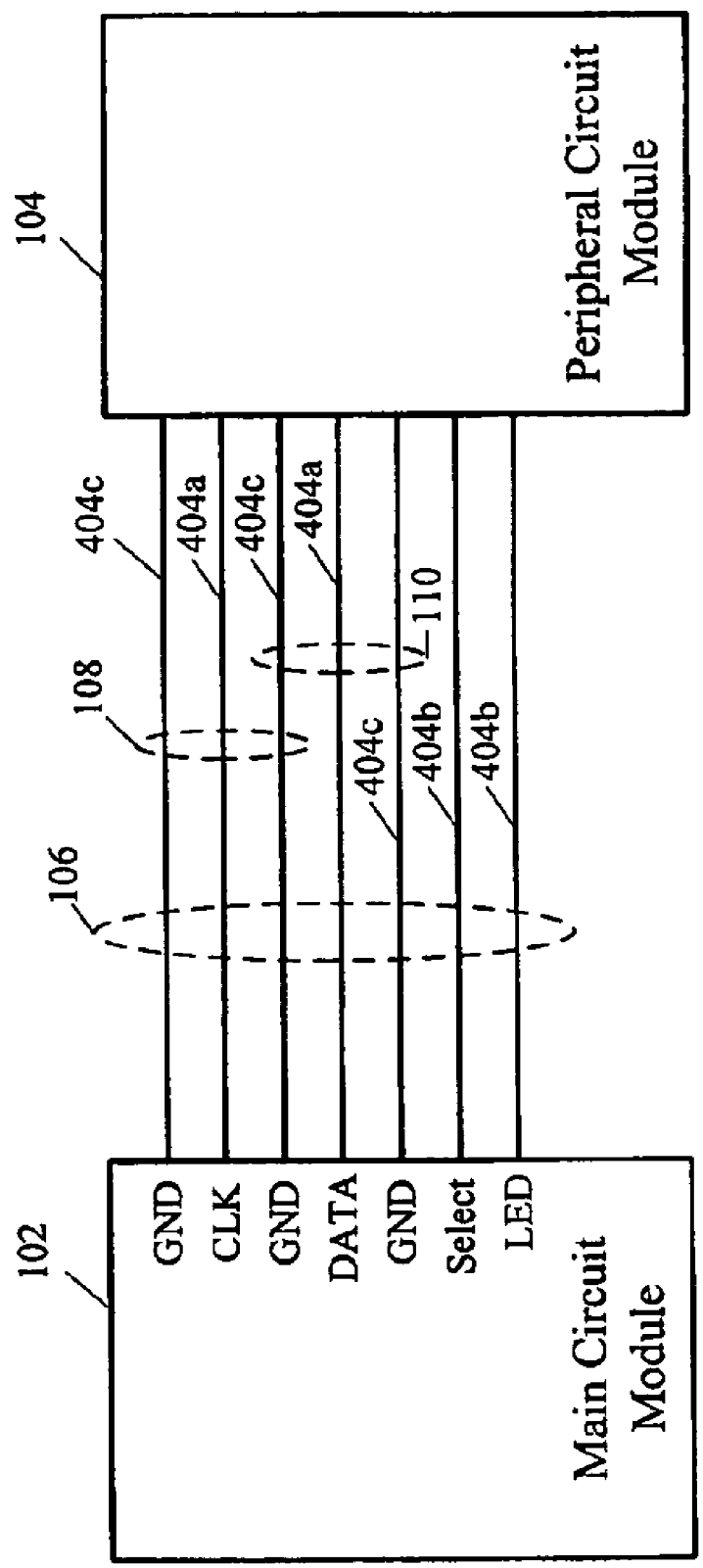
FIG. 1 is a schematic block diagram of prior art main and peripheral circuit modules coupled together by a multi-conductor cable.

While the present invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the scope of the inventions as defined by the appended claims.

DETAILED DESCRIPTION OF SPECIFIC EMBODIMENTS

Referring now to the drawings, the details of specific example embodiments of the present invention are schematically illustrated. Like elements in the drawings will be represented by like numbers, and similar elements will be represented by like numbers with a different lower case letter suffix.

Referring to FIG. 1, depicted is a schematic block diagram of prior art main and peripheral circuit modules coupled together by a multi-conductor cable. A main circuit module 102 of an electronic apparatus, e.g., computer, hard disk drive, etc., may be connected to a peripheral circuit module 104, e.g., printer, digital camera, etc., with a cable 106. The cable 106 comprises a plurality of conductors 404 that are insulated from one another. Some of the conductors 404a carry high speed data and clock signals, some other of the conductors 404b carry low speed or steady state transitional signals, e.g., LED and Select, and still other conductors 404c are for power and/or safety ground returns (GND). The cable 106 may be a ribbon or flex cable, generally represented by the numeral 400, as illustrated in FIGS. 4 and 5 (FIG. 4 depicts a schematic plan view of a ribbon or flex cable and FIG. 5 depicts a schematic sectional view taken at section A-A of the ribbon cable illustrated in FIG. 4), wherein the ribbon or flex cable 400 comprises conductors 404 arranged in a plane with insulation 402 therebetween. The cable 106 may also be any other type of cable including but not limited to multi-conductor cable and twisted pair cable.

In the cable 106 illustrated in FIG. 1, ground return conductors 404c are located on either side of a respective signal conductor 404a and form low electromagnetic radiation sub-cables 108 and 110 since the signal conductor 404a that emits electromagnetic radio frequency interference is closely coupled to low impedance ground return conductors 404c. The cable 106 illustrated in FIG. 1 will have low emitted electromagnetic radiation as taught by "Introduction to Electromagnetic Compatibility" by Clayton R. Paul, however, the cost, size and complexity of the cable 106 may be more then can be justified in a competitive electronic product.

Figure 2:
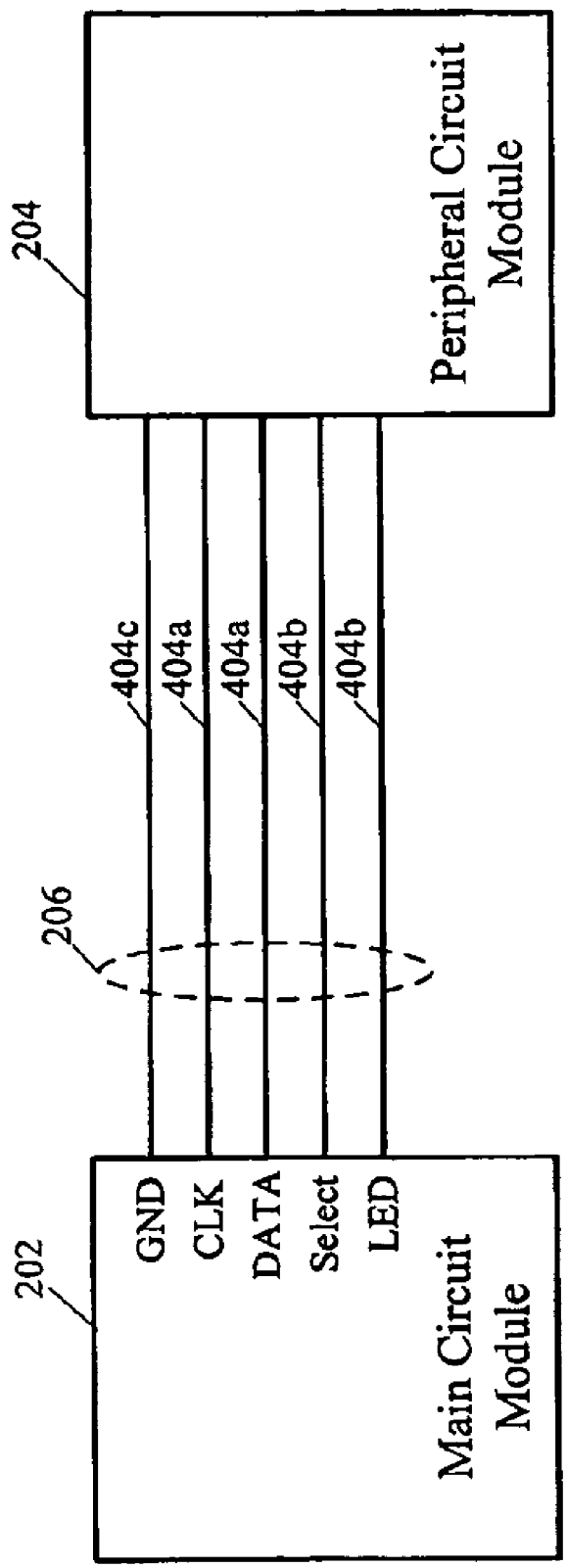
FIG. 2 is a schematic block diagram of a prior art main and peripheral circuit modules coupled together by a lower cost multi-conductor cable.

Referring to FIG. 2, depicted is a schematic block diagram of a prior art main and peripheral circuit modules coupled together by a lower cost multi-conductor cable. A main circuit module 202 of an electronic apparatus, e.g., computer, hard disk drive, etc., may be connected to a peripheral circuit module 204, e.g., printer, digital camera, etc., with a cable 206. The cable 206 comprises a plurality of conductors 404 that are insulated from one another. Some of the conductors 404a carry high speed data and clock signals, some other of the conductors 404b carry low speed or steady state transitional signals, e.g., LED and Select, and one other conductors 404c is used as a ground return (GND). The cable 206 may be a ribbon or flex cable, generally represented by the numeral 400, as illustrated in FIGS. 4 and 5 (FIG. 4 depicts a schematic plan view of a ribbon or flex cable and FIG. 5 depicts a schematic sectional view taken at section A-A of the ribbon cable illustrated in FIG. 4), wherein the ribbon or flex cable 400 comprises conductors 404 arranged in a plane with insulation 402 therebetween. The cable 206 may also be any other type of cable including but not limited to multi-conductor cable and twisted pair cable.

In the cable 206 illustrated in FIG. 2, there is only a single ground return conductor 404c, or just a few conductors 404c. The cable 206 does not have an optimum number of ground return conductors 404c for interference reduction purposes and thus electromagnetic radio frequency interference will not be suppressed as effectively as does the cable 106 illustrated in FIG. 1. The cable 206 is inexpensive, less costly and easier to fabricate then the cable 106, but is not very effective at reducing electromagnetic radio frequency interference that may be emitted therefrom.

Figure 3:
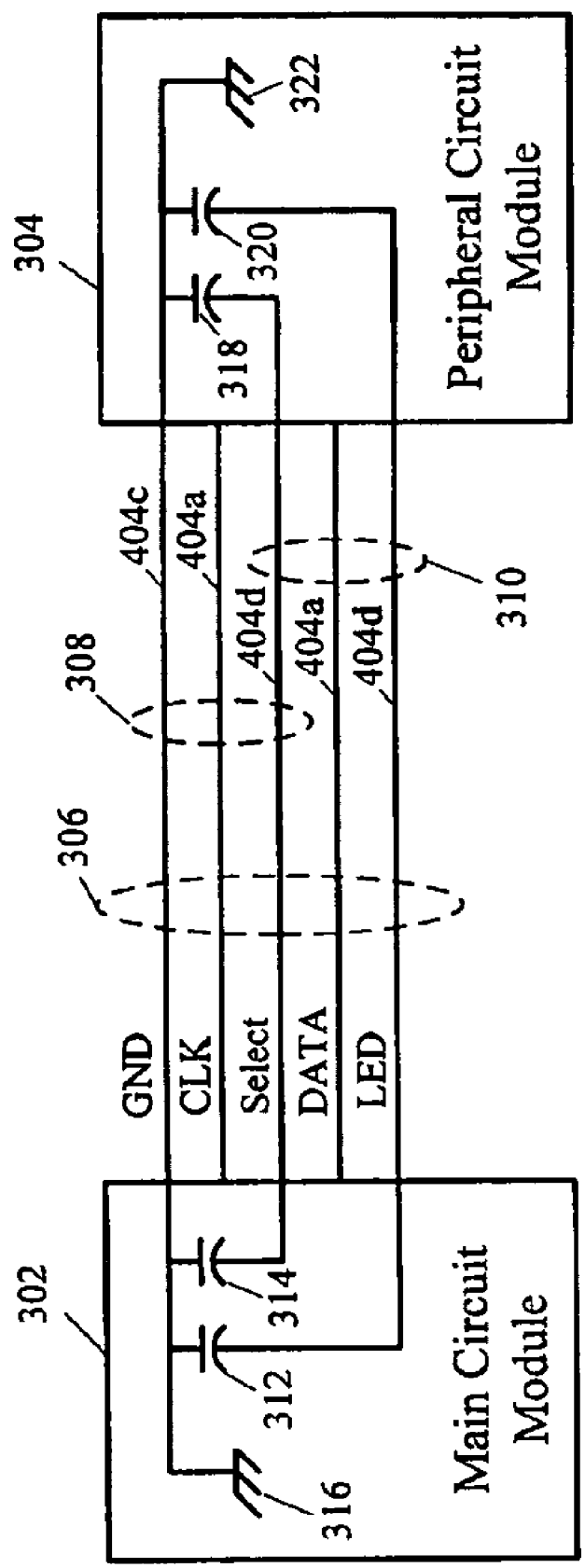
FIG. 3 is a schematic block diagram of main and peripheral circuit modules coupled together by a multi-conductor cable, according to a specific example embodiment of the present invention.

Referring to FIG. 3, depicted is a schematic block diagram of main and peripheral circuit modules coupled together by a multi-conductor cable, according to a specific example embodiment of the present invention. A main circuit module 302 of an electronic apparatus, e.g., computer mother board, video card, PCI card, modem card, local area network card, hard disk interface card, etc., may be connected to a peripheral circuit module 304, e.g., printer, digital camera, scanner, video display, etc., with a cable 306. The main circuit module and peripheral circuit module may be any two modules within a product with a cable between them. The cable 306 comprises a plurality of conductors 404 that may be insulated from one another. Some of the conductors 404a carry high speed data and clock signals, some other of the conductors 404d carry low speed or steady state transitional signals, e.g., LED and Select, and at least one other conductor 404c may be a power and/or safety ground return (GND). The cable 306 may be a ribbon or flex cable, generally represented by the numeral 400, as illustrated in FIGS. 4 and 5 (FIG. 4 depicts a schematic plan view of a ribbon or flex cable and FIG. 5 depicts a schematic sectional view taken at section A-A of the ribbon cable illustrated in FIG. 4), wherein the ribbon or flex cable 400 comprises conductors 404 arranged in a plane with insulation 402 therebetween. The cable 306 may also be any other type of cable including but not limited to multi-conductor cable and twisted pair cable.

Signals in an electronic apparatus may operate at various speeds, e.g., high-speed (fast clock rate) signals are used to transfer large amounts of data in a short time period, while other signals may operate at lower speeds for status indication and/or some type of feedback and/or control to/from a user of the electronic apparatus. According to a specific example embodiment of the present invention, the cable 306 conductors 404d that may carry the slower speed and/or transitional signals (e.g., LED and Select illustrated in FIG. 3) may be used for a dual purpose.

The conductors 404d may be used to create "virtual ground" returns for the high-speed signals (e.g., CLK and DATA illustrated in FIG. 3) without compromising, e.g., substantially compromising, operation of the low-speed and/or transitional signals thereon. To accomplish this, capacitance may be added at each end of a low-speed signal conductor 404d and a signal ground. For example, capacitors 312 and 314 may be added at the main circuit module 302 and connected in parallel with each slow-speed and/or transitional signal conductor 404d and signal ground 316. Likewise, capacitors 318 and 320 may be added at the peripheral circuit module 304 and connected in parallel with each slow-speed and/or transitional signal conductor 404d and signal ground 322.

Capacitor values may be selected so that the total connected capacitance on each of the signal conductors 404d will present a very low impedance at the high-speed signal frequencies and a high impedance at the low-speed signal frequencies. Thus, each conductor 404d may be used for carrying a low-speed signal and as a high-speed signal ground return. By placing the high-speed signal ground return conductors 404d in close proximity with the associated high-speed signal conductors 404a, e.g., in the cases of ribbon cables and flex cables on either side of the high-speed signal conductor, emission of electromagnetic radio frequency interference may be effectively reduced from the cable 306. An example of this is illustrated as sub-cable portions 308 and 310.

Preferably, the reactance (impedance) of the parallel connected capacitance may be less than about one-tenth (1/10) the characteristic impedance of the high-speed signal conductor 404a in combination with its respective closest high-speed signal ground return conductor(s) 404d. Most preferably, the reactance (impedance) of the parallel connected capacitance may be less than about one-one-hundred (1/100) the characteristic impedance of the cable 306 at the lowest frequency at which undesired electromagnetic interference is expected in the product (e.g., digital apparatus). For example, in some electronic products, the lowest electromagnetic interference frequency expected may be about 100 MHz. A preferred minimum frequency may be about 30 MHz which is the minimum frequency required for suppression of radiated emissions for most ITE (Information Technology Equipment).

Two of the most commonly used cables for ITE are ribbon cables with round wires and flat flex cables with rectangular conductors, e.g., flexible printed circuit board construction. It is contemplated and within the scope of the present invention that any type of cable having a plurality of signal carrying conductors and ground return conductors in close proximity to each other may benefit in the reduction of emitted electromagnetic radio frequency interference according to the teachings described herein for the present invention. Just as the flat flex cables may benefit from the present invention, so may printed circuit boards not having a continuous ground plane layer (e.g., printed circuit board is not multilayer, only one or two sided conductive foil). The main circuit module and peripheral circuit module may each comprise at least one printed circuit board. Low cost circuit modules may use inexpensive printed circuit boards that may not have a ground plane and therefore, would also benefit from the present invention.

In determining the values necessary for the capacitors, transmission line impedance may be calculated, for example, by using equations more fully explained in "Robust Electronic Design Reference Book" by John R. Barnes, hereby incorporated by reference herein for all purposes. Assuming a ribbon cable is in free space, the transmission line impedance $Z_o$ may be determined by the following equation:

$$Z_O \approx \sqrt{\frac{\mu}{\varepsilon}} \cdot \frac{1}{\pi} \cdot \ln\left[\frac{S}{D} + \sqrt{\frac{S^2}{D^2} - 1}\right]$$

Where $Z_o$ is the transmission line impedance, $\mu$ and $\epsilon$ are the permeability and permittivity, respectively, S is the separation between the center of the two wires and D is the diameter of the wires.

Assuming a flex cable is in free space, the transmission line impedance $Z_o$ may be determined by the following equation:

$$Z_O \approx \sqrt{\frac{\mu}{\varepsilon}} \cdot \frac{1}{\pi} \cdot \ln\left[2 \cdot \frac{\sqrt{\frac{2 \cdot W}{S} + 1} + 1}{\sqrt{\frac{2 \cdot W}{S} + 1} - 1}\right]$$

Where $Z_o$ is the transmission line impedance, $\mu$ and $\epsilon$ are the permeability and permittivity, respectively, S is the separation between the center of the two wires and W is the width of the conductors.

For example, a transmission line has an impedance of about 110 ohms and the lowest frequency of undesired electromagnetic interference is about 30 MHz, capacitors of about 0.1 µF may be coupled to each end of a ground return conductor 404d and the respective signal grounds of each printed circuit board (302 and 304) or assembly. The reactance (impedance) of the 0.1 µF capacitors, one at each end of the conductor 404d is approximately 0.05 ohm at 30 MHz. Therefore, at and above the electromagnetic radio frequencies desired to be suppressed, the conductors 404d appear to be at radio frequency ground potential and may effectively act as virtual ground return conductors for the reduction of electromagnetic radio frequency interference.

It is contemplated and within the scope of the present invention that conductors carrying power may also be bypassed with the appropriate value capacitors so as to function as virtual ground return conductors for electromagnetic radio frequency interference reduction. Slow-speed signals carried on conductors 404d may be, for example but not limited to, light emitting diode (LED) indicator, speaker, paper sensor, status flags, etc. The present invention therefore may, according to an embodiment, facilitate low cost and compact cables that may have low electromagnetic radio frequency emissions.

It is also possible that the placement of the capacitors can be located close to the connectors to possibly minimize the return current path of the high speed circuit.

While the invention has been depicted, described, and is defined by reference to specific example embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described specific embodiments of the invention are examples only, and are not exhaustive of the scope of the invention. Consequently, the invention is intended to be limited only by the scope of the appended claims, giving full cognizance to equivalents in all respects.

What is claimed is:

1. A digital apparatus using a multi-conductor cable having virtual ground returns for reduction of electromagnetic radiated emissions, comprising:

a main circuit module;

a peripheral circuit module;

a cable with two ends connecting at one of the two ends to the main circuit module and connecting at another of the two ends to the peripheral circuit module, the cable having at least three single-wire conductors extending between the two ends with insulation there between, wherein the cable is configured to couple high speed and low-speed signals between the main and peripheral circuit modules on a respective one of the at least three conductors, at least another of the at least three conductors being a ground return; and a plurality of capacitors, wherein the respective one of the at least three conductors that is configured to couple the low-speed signals between the main and peripheral circuit modules are connected at the one of the two ends of the cable to one side of a first capacitor of the plurality of capacitors and connected at the another of the two ends to one side of a second capacitor of the plurality of capacitors including another side of the first and second capacitors being connected to the ground return at the each of the two ends of the cable, the first and second capacitors bridging the respective one of the at least three conductors that couples the high speed signals between the main and peripheral circuit modules at the each of the two ends of the cable, wherein the plurality of capacitors has a total connected capacitance on the each of the two ends of the cable during use corresponding to a low impedance relative to the frequencies of the high speed signals and a high impedance relative to the frequencies of the low-speed signals.

2. The digital apparatus according to claim 1, further including at least two more conductors extending between the two ends of the cable, one of the at least two more conductors configured to carry the high speed signals between the main and peripheral circuit modules and another of the at least two more conductors configured to carry the low-speed signals between the main and peripheral circuit modules, wherein the another of the at least two more conductors connects at the one of the two ends of the cable to one side of a third capacitor of the plurality of capacitors and connects at the another of the two ends to one side of a fourth capacitor of the plurality of capacitors including another side of the third and fourth capacitors being connected to the ground return at the each of the two ends of the cable, the third and fourth capacitors bridging the one of the at least two more conductors that is configured to couple the high speed signals between the main and peripheral circuit modules at the each of the two ends of the cable.

3. The digital apparatus according to claim 2, wherein the first and second capacitors are arranged in parallel to the third and fourth capacitors of the plurality of capacitors, respectively.

4. The digital apparatus according to claim 2, wherein the respective one of the at least three conductors that is configured to couple the high speed signals between the main and peripheral circuit modules and the one of the at least two more conductors configured to carry the high speed signals between the main and peripheral circuit modules are arranged in the cable between the ground return and the another of the at least two more conductors configured to carry the low-speed signals between the main and peripheral circuit modules.

5. The digital apparatus according to claim 1, wherein the respective one of the at least three conductors coupling the high speed and low-speed signals are adjacent to one another.

6. The digital apparatus according to claim 1, wherein the at least three conductors comprise twisted pairs of conductors, wherein one conductor of the twisted pair couples a high-speed signal and the other conductor of the twisted pair couples a low-speed signal.

7. The digital apparatus according to claim 1, wherein the cable is a ribbon cable.

8. The digital apparatus according to claim 7, wherein adjacent conductors of the ribbon cable alternate between coupling a high-speed and a low-speed signal.

9. The digital apparatus according to claim 1, wherein the cable is a flex cable.

10. The digital apparatus according to claim 9, wherein adjacent conductors of the flex cable alternate between coupling a high-speed and a low-speed signal.

11. The digital apparatus according to claim 1, wherein the total connected capacitance on the each of the two ends of the cable is less than about one tenth of a characteristic impedance of the respective one of the at least three conductors that is configured to couple the high speed signals between the main and peripheral circuit modules in combination with a characteristic impedance of the ground return.

12. The digital apparatus according to claim 1, wherein the total connected capacitance on the each of the two ends of the cable is less than about one one-hundredth of a characteristic impedance of the respective one of the at least three conductors that is configured to couple the high speed signals between the main and peripheral circuit modules in combination with a characteristic impedance of the ground return.

13. The digital apparatus according to claim 1, wherein a desired lowest electromagnetic interference frequency is less than or equal to about 100 MHz.

14. The digital apparatus according to claim 1, wherein a desired minimum frequency required for submission of the electromagnetic radiated emissions is less than or equal to about 30 MHz.

15. The digital apparatus according to claim 1, wherein the high-speed signals are selected from the group consisting of clock and data.

16. The digital apparatus according to claim 1, wherein the low-speed signals are selected from the group consisting of status, control and indication.

17. The digital apparatus according to claim 1, wherein the main circuit module is selected from the group consisting of computer mother board, video card, PCI card, modem card, local area network card, and hard disk interface card.

18. The digital apparatus according to claim 1, wherein the peripheral circuit module is selected from the group consisting of printer, digital camera, scanner, and video display.

19. The digital apparatus according to claim 1, wherein the main circuit module is a printed circuit board.

20. The digital apparatus according to claim 19, wherein the printed circuit board does not have a ground plane.

21. The digital apparatus according to claim 1, wherein the first and second capacitors each have values of about 0.1 μF.

22. A method for reducing electromagnetic radiated emissions from a digital apparatus, said method comprising the steps of:

providing a cable having two ends and at least three conductors extending between the two ends for coupling high-speed and low-speed signals and to provide a ground return on respective ones of the at least three conductors between main and peripheral circuit modules; and connecting a first capacitor at one end of the two ends of the cable between the ground return and one of the at least three conductors that couples the low-speed signals between the main and peripheral circuit modules thereby bridging at the one end of the two ends of the cable another conductor of the at least three conductors that couples the high-speed signals between the main and peripheral circuit modules; and connecting a second capacitor at another end of the two ends of the cable between the ground return and the one of the at least three conductors that couples the low-speed signals between the main and peripheral circuit modules thereby bridging at the another end of the two ends of the cable the another conductor of the at least three conductors that couples the high-speed signals between the main and peripheral circuit modules, wherein each of the first and second capacitors makes a total connected capacitance on the one and another ends of the two ends of the cable during use correspond to a low impedance relative to the frequencies of the high-speed signals and a high impedance relative to the frequencies of the low-speed signals.

23. The method according to claim 22, further including connecting a third capacitor at the one end of the two ends of the cable between the ground return and at least one more conductor extending between the two ends, the at least one more conductor configured to couple the low-speed signals between the main and peripheral circuit modules, the connecting the third capacitor thereby bridging at least a fifth conductor extending between the two ends, the at least fifth conductor configured to couple the high-speed signals between the main and peripheral circuit modules.

24. The method according to claim 23, further including connecting a fourth capacitor at the another end of the two ends of the cable between the ground return and the at least one more conductor extending between the two ends, the connecting the fourth capacitor thereby bridging the at least fifth conductor extending between the two ends.

25. The method according to claim 24, wherein the connecting the third and fourth capacitor further includes connecting the third and fourth capacitors in parallel to the first and second capacitors, respectively.

26. The method according to claim 22, wherein the connecting the first and second capacitors further includes making the total connected capacitance on the one and another of the two ends of the cable less than about one tenth or less than about one one-hundredth of a characteristic impedance of the another conductor of the at least three conductors that couples the high-speed signals between the main and peripheral circuit modules in combination with a characteristic impedance of the ground return.

27. The method according to claim 22, wherein the providing the cable with the connected first and second capacitors reduces emissions of electromagnetic radio frequency interference during operating the main and peripheral circuit modules by way of communicating with the high-speed and low-speed signals along the cable.

28. The method according to claim 22, wherein the connecting the first and second capacitors further includes connecting two capacitors each having a value of about 0.1 µF.

* * * * *